(12) United States Patent
Hsu et al.

(10) Patent No.: US 10,062,649 B2
(45) Date of Patent: Aug. 28, 2018

(54) PACKAGE SUBSTRATE

(71) Applicant: PHOENIX PIONEER TECHNOLOGY CO., LTD., Hsinchu County (TW)

(72) Inventors: Shih-Ping Hsu, Hsinchu County (TW); Chih-Kuai Yang, Hsinchu County (TW)

(73) Assignee: PHOENIX & CORPORATION, Grand Cayman (KY)

( * ) Notice: Subject to any disclaimer, the term of this patent is extended or adjusted under 35 U.S.C. 154(b) by 73 days.

(21) Appl. No.: 15/386,456

(22) Filed: Dec. 21, 2016

(65) Prior Publication Data

US 2017/0207173 A1 Jul. 20, 2017

(30) Foreign Application Priority Data

Jan. 15, 2016 (TW) .............................. 105101273 A

(51) Int. Cl.
| | | |
|---|---|---|
| H01L 23/48 | (2006.01) |
| H01L 23/538 | (2006.01) |
| H01L 23/31 | (2006.01) |
| H01L 25/065 | (2006.01) |
| H05K 1/11 | (2006.01) |
| H05K 1/18 | (2006.01) |
| H01L 21/56 | (2006.01) |

(52) U.S. Cl.
CPC ...... *H01L 23/5389* (2013.01); *H01L 23/3121* (2013.01); *H01L 23/5383* (2013.01); *H01L 23/5384* (2013.01); *H01L 23/5386* (2013.01); *H01L 25/0655* (2013.01); *H05K 1/115* (2013.01); *H05K 1/185* (2013.01); *H01L 21/568* (2013.01); *H05K 2201/10015* (2013.01)

(58) Field of Classification Search
CPC ............. H01L 23/5389; H01L 23/5383; H01L 23/5384; H01L 23/5386; H01L 23/3121; H01L 25/0655; H05K 1/115; H05K 1/185
USPC ........................................................ 257/774
See application file for complete search history.

(56) References Cited

U.S. PATENT DOCUMENTS

| | | | | |
|---|---|---|---|---|
| 8,796,846 B2 * | 8/2014 | Lin | ...................... | H01L 21/6835 257/686 |
| 9,640,504 B2 * | 5/2017 | Pagaila | ................... | H01L 24/18 |
| 2005/0230848 A1 * | 10/2005 | Nakatani | ............. | H01L 21/4857 257/783 |
| 2009/0170241 A1 * | 7/2009 | Shim, II | ................ | H01L 21/568 438/107 |
| 2009/0236686 A1 * | 9/2009 | Shim, II | ................ | H01L 21/568 257/528 |
| 2014/0185258 A1 * | 7/2014 | Lee | ................... | H01L 23/49822 361/761 |
| 2017/0141053 A1 * | 5/2017 | Chen | ....................... | H01L 24/02 |

* cited by examiner

*Primary Examiner* — Kevin M Picardat
(74) *Attorney, Agent, or Firm* — WPAT, PC

(57) ABSTRACT

This disclosure provides a package substrate which includes: a first conductive layer having a first conductive area and a second conductive area; a package unit layer disposed on the first conductive layer and including a first circuit device having a first terminal connected to the first conductive area and a second terminal connected to the second conductive area, a first conductive pillar connected to the first conductive area, and an encapsulant material; and a second conductive layer disposed on the package unit layer and having a first metal wire connected to the first conductive pillar.

10 Claims, 5 Drawing Sheets

PACKAGE SUBSTRATE

CROSS REFERENCE TO RELATED APPLICATION

This application claims the benefit of Taiwan application Serial No. 105101273, filed on Jan. 15, 2016, the disclosure of which is incorporated by reference herein in its entirety.

FIELD OF THE INVENTION

The present invention relates to a package substrate and its fabrication method.

BACKGROUND OF THE INVENTION

As recent rapid trend in modern electronic devices is not only toward lighter and smaller devices, but also toward multi-function and high-performance devices, the integrated-circuit (IC) fabrication and technology has to evolve correspondingly toward a more high-density and miniature design so as to allow more electronic components to be received inside limited chip space. Consequently, the relating IC package substrate and the package technology are evolved accordingly to meet the trend.

In the art, a package substrate can be formed by the core substrate process, which can be illustrated in FIG. 1A-1D. The upper-layer circuitry wires 12 and the lower-layer circuitry wires 13 are respectively formed on the top and bottom surfaces of the core substrate 11 as shown in FIG. 1A, before the circuit devices 14a and 14b are embedded in the core substrate 11. Opening windows are then formed in the core substrate 11 to be used to receive the circuit devices 14a and 14b, and the adhesive film 15 is adhered to the bottom of the lower-layer circuitry wires 13; thus, the circuit devices 14a and 14b can be disposed in the opening windows as shown in FIG. 1B. The dielectric layer 16 is then formed to cover the core substrate 11, the upper-layer circuitry wires 12, the lower-layer circuitry wires 13 and the circuit devices 14a and 14b. Then, the connection holes 17 are formed as shown in FIG. 1C. At last, the conductive metal layer 18 is formed on the dielectric layer 16 while enabling it to fill up the connection holes 17 as shown in FIG. 1D, so that the upper-layer circuitry wires 12, the lower-layer circuitry wires 13, and the circuit devices 14a and 14b can be connected to an external circuit. However, it is rather costly to form the opening windows in the core substrate 11. Also, it might need the costly and time-consuming laser engraving process to form the connection holes 17 in the dielectric layer 16 while enabling it to be aligned with the terminals of the circuit devices 14a and 14b. Therefore, it is in need of a new and advanced packaging solution.

SUMMARY OF THE INVENTION

According to one aspect of the present disclosure, one embodiment provides a package substrate, which comprises: a first conductive layer having a first conductive area and a second conductive area; a package unit layer disposed on the first conductive layer and including a first circuit device having a first terminal connected to the first conductive area and a second terminal connected to the second conductive area, a first conductive pillar connected to the first conductive area, and an encapsulant material; and a second conductive layer disposed on the package unit layer and having a first metal wire connected to the first conductive pillar.

In the embodiment, the first circuit device is an integrated-circuit chip or a multi-layer ceramic capacitor.

In the embodiment, the package unit layer consists of the first circuit device, the first conductive pillar and the encapsulant material.

In the embodiment, the package unit layer further comprises a second conductive pillar connected to the second conductive area, and the second conductive layer further comprises a second metal wire connected to the second conductive pillar.

In the embodiment, the package unit layer further comprises a second circuit device having a third terminal connected to the first conductive area.

In the embodiment, the first conductive layer further comprises a third conductive area, and the package unit layer further comprises: a second circuit device having a third terminal connected to the first conductive area and a fourth terminal connected to the third conductive area; a second conductive pillar connected to the second conductive area; and a third conductive pillar connected to the third conductive area.

In the embodiment, the package unit layer further comprises a connection unit, and the second conductive layer further comprises a second metal wire connected to the second terminal of the first circuit device through the connection unit.

In the embodiment, the package unit layer further comprises a first connection unit, a second connection unit and a third connection unit; and the second conductive layer further comprises a second metal wire connected to the second terminal of the first circuit device through the first connection unit, and a third metal wire connected to the first terminal of the first circuit device through the second connection unit; wherein the first metal wire is connected to the third terminal of the second circuit device through the third connection unit.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention and wherein.

DESCRIPTION OF THE EXEMPLARY EMBODIMENTS

For your esteemed members of reviewing committee to further understand and recognize the fulfilled functions and structural characteristics of the invention, several exemplary embodiments cooperating with detailed description are presented as the follows.

In the following embodiments of the present disclosure, when an element is described to be disposed above/mounted on top of or below/under another element, it comprises either the element is directly or indirectly disposed above/below the other element, i.e. when indirectly, there can be some other element arranged between the two; and when directly, there is no other element disposed between the two. It is noted that the descriptions in the present disclosure relate to "above" or "below" are based upon the related diagrams provided, but are not limited thereby. Moreover, the terms "first", "second", and "third", and so on, are simply used for clearly identifying different elements of the same nature, but those elements are not restricted thereby and must be positioned or arranged accordingly. In addition, the size or thickness of each and every element provided in the following diagrams of the present disclosure is only schematic representation used for illustration and may not represent its actual size.

Figure 1A:
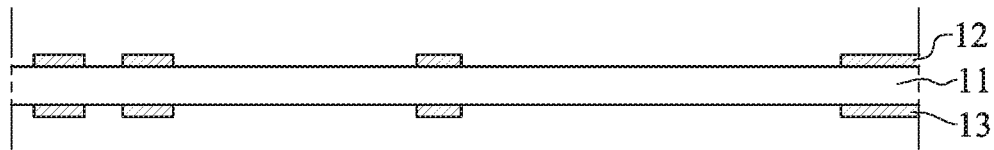
FIG. 1A-1D are cross-sectional views of a core-substrate-based package substrate, corresponding to different process steps.
Figure 1B:
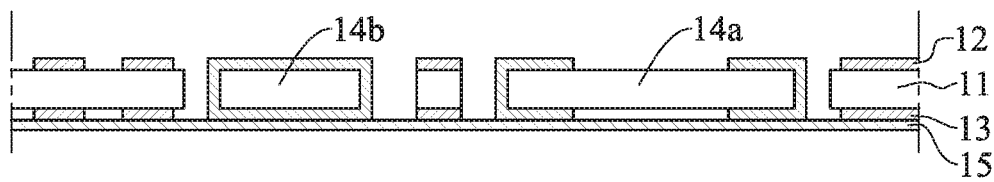
Figure 1C:
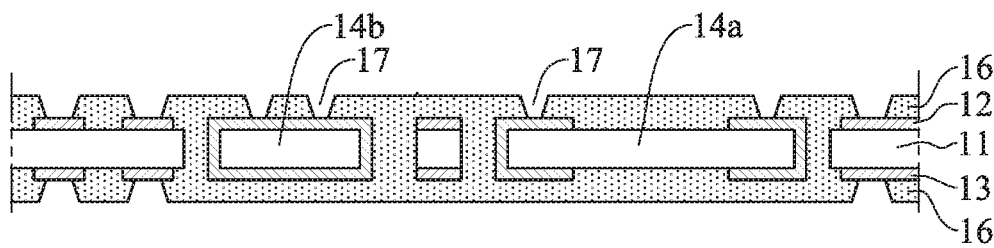
Figure 1D:
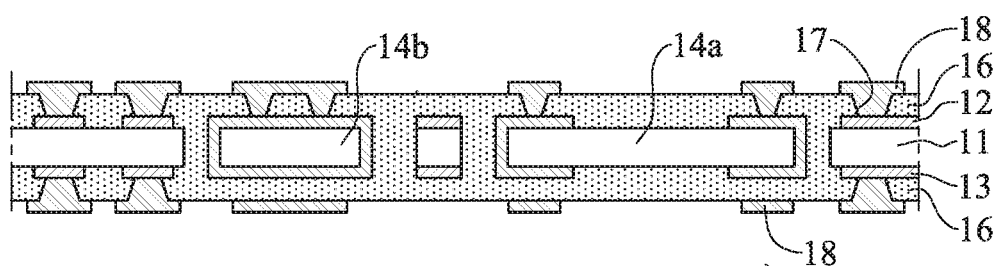
Figure 2:
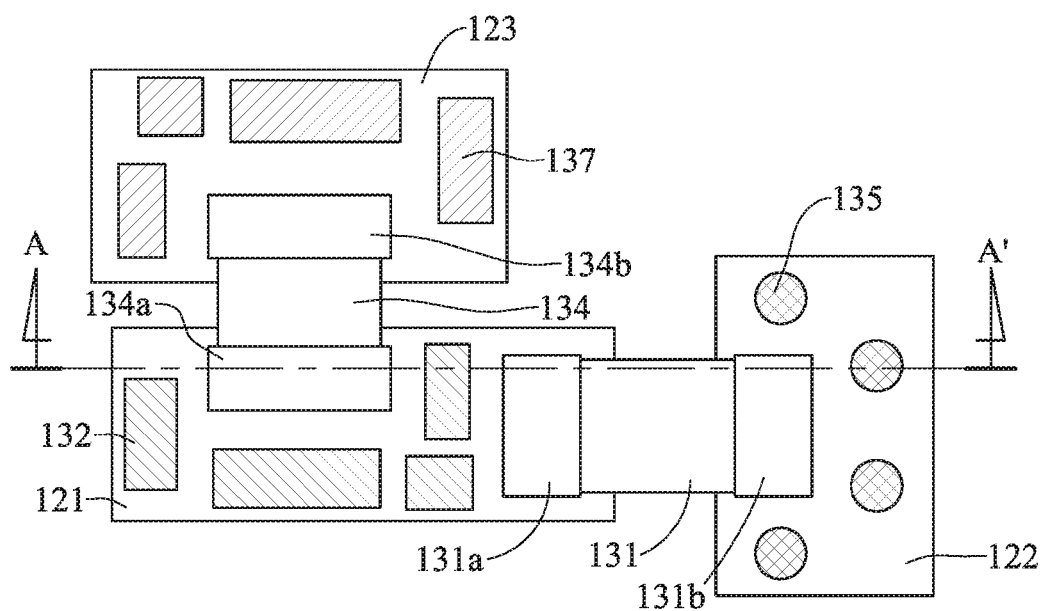
FIG. 2 is a top view of a package substrate according to a first embodiment of the present invention.
Figure 3:
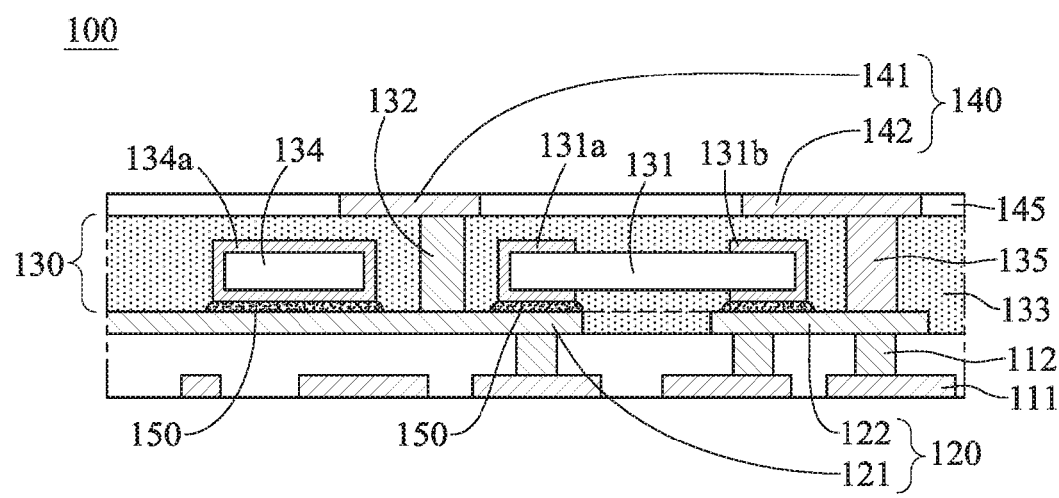
FIG. 3 is a cross-sectional view of the package substrate cut along the line AA' in FIG. 2.

FIG. 2 shows a top view of a package substrate 100 according to a first embodiment of the present invention, and FIG. 3 is a cross-sectional view of the package substrate 100 cut along the line AA' in FIG. 2. The package substrate 100 is a layered structure formed on circuitry wires 111 and metal pillars 112 and including a first conductive layer 120, a package unit layer 130 and a second conductive layer 140. The circuitry wires 111 are to be used for constructing the lower-layer circuitry layout of the package substrate 100, and the metal pillars 112 are used to connect the first conductive layer 120 to the circuitry wires 111. The first conductive layer 120 is formed with at least one conductive area or metal wire, e.g. conductive areas 121, 122 and 123 as shown in FIGS. 2 and 3. The package unit layer 130 includes at least one circuit device and at least one conductive pillar on the first conductive layer 120. The circuit device can be an integrated-circuit chip or a surface mounted device (SMD) such as multi-layer ceramic capacitor (MLCC). The conductive pillar can be a metal pillar, such as copper pillar, to connect the first conductive layer 120 and the second conductive layer 140 through the package unit layer 130. Here the package unit layer 130 includes circuit devices 131 and 134 and conductive pillars 132 and 135 as shown in FIGS. 2 and 3. The remainder part of the package unit layer 130 is filled with an encapsulant material 133, so as to enclose and fix the circuit devices 131 and 134 and the conductive pillars 132 and 135 as well as to resist the deformation or warpage incurred in the package unit layer 130. The second conductive layer 140 is formed with at least one conductive area or metal wire on the package unit layer 130, to be used for constructing the upper-layer circuitry layout of the package substrate 100. Here the second conductive layer 140 includes metal wires 141 and 142 as shown in FIGS. 2 and 3. The encapsulant material 133 can be formed of a dielectric molding compound selected from the group consisting of novolac-based resin, epoxy-based resin and silicon-based resin by an appropriate molding means like top molding, compression molding, transfer molding or injection molding.

In the embodiment, the circuit devices 131 and 134 are adhered to the first conductive layer 120 by using a conductive pad 150, which can be formed by screen printing, inkjet printing, or dispensing. In such a way, the fabrication process of the package substrate 100 is simple, the alignment tolerance of arranging the circuit devices 131 and 134 on the first conductive layer 120 can be improved remarkably, and thus the fabrication cost can be reduced. Also, the conductive areas 121 and 122 can be designed to be a large area of metal foil, acting as a power plane or a ground plane. Here, the circuit device 131 has two terminals 131a and 131b respectively connected to the conductive areas 121 and 122, and the circuit device 134 has two terminals 134a and 134b respectively connected to the conductive areas 121 and 123 as shown in FIGS. 2 and 3. The terminals 131a, 131b, 134a and 134b are made of metal such as Cu, Sn, Al, Sn—Cu alloy, Sn—Pb alloy, and Sn—Ag—Cu alloy. If the terminals 131a, 131b, 134a and 134b have a large cross-sectional area, the circuit devices 131 and 134 can be bonded to the first conductive layer 120 with a large contact area and thus a small electrical resistance therebetween.

In the prior-art package substrate as shown in FIG. 1A-1D, the circuit device 14a is connected to the conductive metal layer 18, the outermost circuit layer of the package substrate, through the connection holes 17. By contrast, the circuit device 131 can be adhered to the first conductive layer 120, the lowermost circuit layer of the package substrate 100, only by use of the conductive pad 150 in the embodiment. Since the conductive areas 121 and 122 can be designed to be a large area of metal foil, the alignment tolerance of arranging the circuit devices 131 and 134 on the first conductive layer 120 is improved.

As shown in FIGS. 2 and 3, the conductive pillar 132 is configured for connecting the conductive area 121 of the first conductive layer 120 to the metal wire 141 of the second conductive layer 140, and the conductive pillar 135 is configured for connecting the conductive area 122 of the first conductive layer 120 to the metal wire 142 of the second conductive layer 140. The conductive pillars 132 and 135 may have a cross-section of any appropriate shape, such as circle, oval and rectangle, to be arranged on one of the conductive areas 121, 122 and 123 of the first conductive layer 120. The cross-section can be designed to have a large area, so as to diminish the resistance of the conductive pillar. The conductive pillar 132 can be disposed close to the circuit device 131, so as to diminish reduce the current flow path from the circuit device 131 to an external circuit. In addition, the package unit layer 130 may further include another conductive pillar 137 connected to the conductive area 123 as shown in FIG. 2.

The fabrication process will be described in detail in the following paragraphs. Wherein, FIG. 4A-4E are cross-sectional views of the package substrate 100 according to the embodiment of FIG. 3 in the present disclosure, corresponding to different process steps.

Figure 4A:
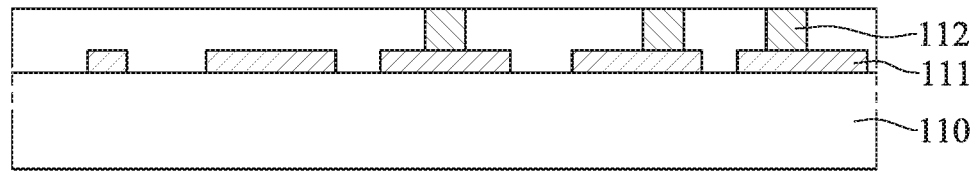
FIG. 4A-4E are cross-sectional views of the package substrate according to the first embodiment in the present disclosure, corresponding to different process steps.

As shown in FIG. 4A, a carrier 110 with circuitry wires 111 and metal pillars 112 formed thereon is provided to carry and support electronic components and conductive wires of the package substrate 100, e.g. the first conductive layer 120, the package unit layer 130, and the second conductive layer 140 in FIG. 3. The carrier 110 can be a metal substrate plate or a fiber-glass core substrate coated with a metal layer, in which the metal can be Fe, Fe/Ni, Cu, Al, or their combination. The circuitry wires 111 and the metal pillars 112 are used to connect the first conductive layer 120 to an external circuit. The circuitry wires 111 act as the lower-layer circuitry layout of the package substrate 100, and the metal pillars 112 are used to connect the first conductive layer 120 to the circuitry wires 111.

Figure 4B:
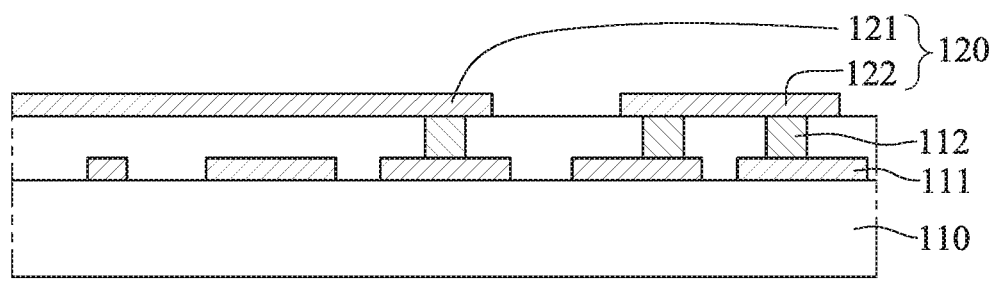

Next, a first conductive layer 120 is formed on the carrier 110 while enabling the first wiring layer 120 to be patterned including at least one conductive area or metal wire, e.g. conductive areas 121 and 122 as shown in FIG. 4B. The first conductive layer 120 can be formed by electrolytic plating or evaporating a metal layer on the carrier 110 and then patterning the metal layer into the conductive areas 121 and 122 by photolithography. The metal layer may be made of Cu, Al, Ni, or their combination.

Figure 4C:
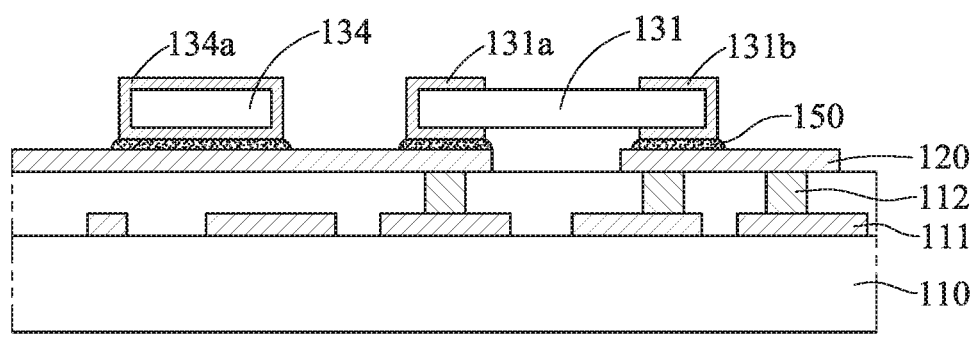

Next, a conductive pad 150 is formed on the first conductive layer 120 by screen printing or inkjet printing, and then circuit devices 131 and 134 are disposed on the conductive pad 150 so that terminals 131a and 131b of the circuit device 131 and terminal 134a of the circuit device 134 can be adhered to the first conductive layer 120, as shown in FIG. 4C. By use of the conductive pad 150, the circuit devices 131 and 134 can be electrically connected to the circuitry wires 111 (the lower-layer circuit of the package substrate 100) through the first conductive layer 120 and the metal pillars 112.

Figure 4D:
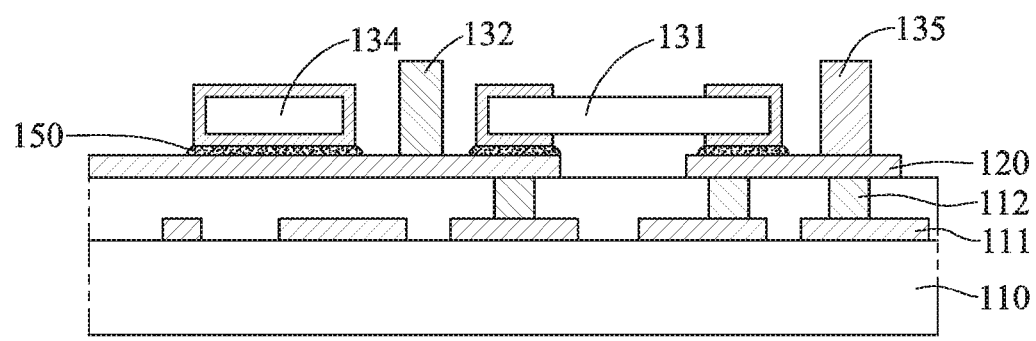

Next, conductive pillars 132 and 135 are formed on the first conductive layer 120 to connect the first conductive layer 120 and the second conductive layer 140, as shown in FIG. 4D. The conductive pillars 132 and 135 can be formed by electrolytic plating or evaporating a metal layer on the first conductive layer 120 and then patterning the metal layer into the conductive pillars 132 and 135 by photolithography.

Figure 4E:
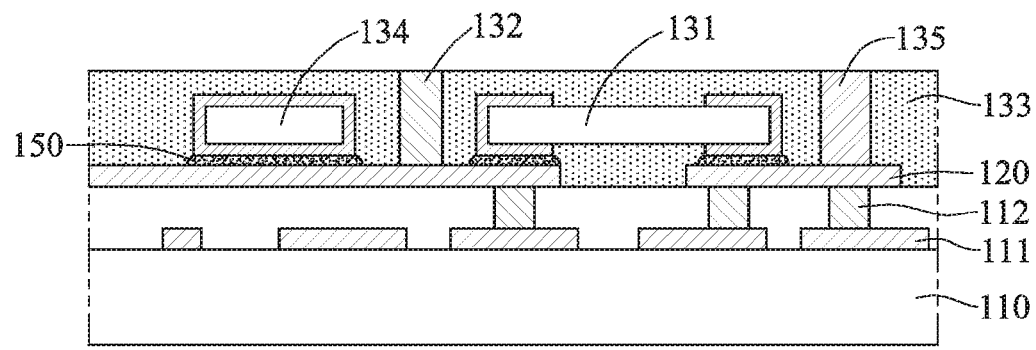

Next, an encapsulant material 133 is formed on the first conductive layer 120 while enabling the encapsulant material 133 to cover the circuit devices 131 and 134 and the conductive pillars 132 and 135 as shown in FIG. 4E, so as to enclose and fix the circuit devices 131 and 134 and the conductive pillars 132 and 135 in the package unit layer 130. The encapsulant material 133 can be formed of a dielectric molding compound selected from the group consisting of novolac-based resin, epoxy-based resin and silicon-based resin by an appropriate molding means like top molding, compression molding, transfer molding or injection molding. The upper part of the encapsulant material 133 can then be removed by polishing, grinding, sand blasting, plasma or chemical etching downwards until the top surface of the circuit devices 131 and 134 is exposed. Thus, the package unit layer 130 includes the circuit devices 131 and 134, the conductive pillars 132 and 135 and the encapsulant material 133 on the first conductive layer 120.

Next, a second conductive layer 140 is formed on the package unit layer 130 while enabling the second conductive layer 140 to be patterned including at least one conductive area or metal wire, e.g. metal wires 141 and 142 as shown in FIG. 3. The second conductive layer 140 is to be used for constructing the upper-layer circuitry layout of the package substrate 100, and can be formed by electrolytic plating or evaporating a metal layer on the package unit layer 130 and then patterning the metal layer into the metal wires 141 and 142 by photolithography. The metal layer may be made of Cu, Al, Ni, or their combination. Moreover, the remainder part of the second conductive layer 140 can be filled with a dielectric material, acting as a protective layer 145 to protect the package substrate 100 from any adverse affect of its surrounding environment or posterior processes such as soldering. Thus, the package substrate 100 of FIG. 3 can be obtained after removal of the carrier 110.

Figure 5:
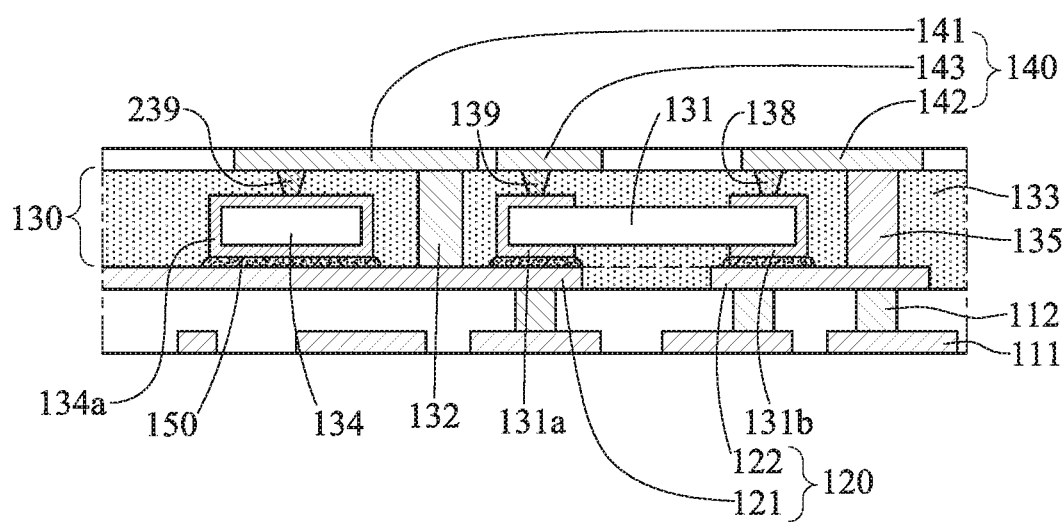
FIG. 5 is a cross-sectional view of a package substrate according to a second embodiment of the present invention.

FIG. 5 shows a cross-sectional view of a package substrate 200 according to a second embodiment of the present invention. The package substrate 200 is a layered structure formed on circuitry wires 111 and metal pillars 112 and including a first conductive layer 120, a package unit layer 130 and a second conductive layer 140, which are very similar to those of the package substrate 100 in the first embodiment and are not described redundantly here. As shown in FIG. 5, the package unit layer 130 further comprises a connection unit 138, and the terminal 131b of the circuit device 131 is connected to the metal wire 142 through the connection unit 138. Thereby, the circuit device 131 can be connected to the upper-layer circuit of the package substrate 200 through its terminal 131b.

In another embodiment, the package unit layer 130 further comprises connection units 139 and 239, and the second conductive layer 140 further comprises a metal wire 143 as shown in FIG. 5. The terminal 131b of the circuit device 131 is connected to the metal wire 142 through the connection unit 138, the terminal 131a is connected to the metal wire 143 through the connection unit 139, and the terminal 134a of the circuit device 134 is connected to the metal wire 141 through the connection unit 239. Thereby, the circuit devices 131 and 134 can be connected to the upper-layer circuit of the package substrate 200 through their terminals 131a, 131b and 134a.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

What is claimed is:

1. A package substrate, comprising:
   a first conductive layer, comprising:
      a first planar conductive area; and
      a second planar conductive area;
   a package unit layer disposed on the first conductive layer, comprising:
      a first circuit device, comprising:
         a first terminal, connected to the first planar conductive area; and
         a second terminal, connected to the second planar conductive area;
      a first conductive pillar, neighboring the first circuit device and connected to the first planar conductive area; and
      an encapsulant material, surrounding the first circuit device and the first conductive pillar; and
   a second conductive layer, disposed on the package unit layer, comprising a first metal wire connected to the first conductive pillar.

2. The package substrate of claim 1, wherein the first circuit device is a multi-layer ceramic capacitor.

3. The package substrate of claim 1, wherein the package unit layer consists of the first circuit device, the first conductive pillar and the encapsulant material.

4. The package substrate of claim 1, wherein the package unit layer further comprises a second conductive pillar connected to the second planar conductive area, and the second conductive layer further comprises a second metal wire connected to the second conductive pillar.

5. The package substrate of claim 1, wherein the package unit layer further comprises a second circuit device having a third terminal connected to the first planar conductive area.

6. The package substrate of claim 1, wherein the first conductive layer further comprises a third conductive area, and the package unit layer further comprises:

a second circuit device having a third terminal connected to the first planar conductive area and a fourth terminal connected to the third conductive area;

a second conductive pillar connected to the second planar conductive area; and a third conductive pillar connected to the third conductive area.

7. The package substrate of claim 1, wherein the package unit layer further comprises a connection unit, and the second conductive layer further comprises a second metal wire connected to the second terminal of the first circuit device through the connection unit.

8. The package substrate of claim 5, wherein the package unit layer further comprises a first connection unit, a second connection unit and a third connection unit; and the second conductive layer further comprises a second metal wire connected to the second terminal of the first circuit device through the first connection unit, and a third metal wire connected to the first terminal of the first circuit device through the second connection unit; wherein the first metal wire is connected to the third terminal of the second circuit device through the third connection unit.

9. The package substrate of claim 1, wherein said first terminal is directly connected to a first conductive pad, said first conductive pad is directly connected to said first planar conductive area, said second terminal is directly connected to a second conductive pad, and said second conductive pad is directly connected to said second planar conductive area.

10. The package substrate of claim 8, wherein said first terminal is directly connected to a first conductive pad, said first conductive pad is directly connected to said first planar conductive area, said second terminal is directly connected to a second conductive pad, and said second conductive pad is directly connected to said second planar conductive area.

* * * * *